United States Patent [19]

Santiago et al.

[11] Patent Number: 5,435,264
[45] Date of Patent: Jul. 25, 1995

[54] PROCESS FOR FORMING EPITAXIAL $BaF_2$ ON GAAS

[75] Inventors: Francisco Santiago, Elkridge; Tak K. Chu; Michael F. Stumborg, both of Bethesda, all of Md.

[73] Assignee: The United States of America as represented by the Secretary of the Navy, Washington, D.C.

[21] Appl. No.: 246,209

[22] Filed: May 19, 1994

[51] Int. Cl.$^6$ ............................................. C30B 25/18
[52] U.S. Cl. ....................................... 117/92; 117/108; 117/940
[58] Field of Search .......................... 117/92, 108, 940

[56] References Cited

U.S. PATENT DOCUMENTS

| 4,368,098 | 1/1983 | Manasevit | 117/104 |
| 4,404,265 | 9/1983 | Manasevit | 117/104 |

OTHER PUBLICATIONS

Clemens et al., "Growth of $BaF_2$ and of $BaF_2/SrF_2$ layers on (001) oriented GaAs", J. Appl. Phys, vol. 66, No. 4, 15 Aug. 1989, pp. 1680–1685.
Truscott et al., "MBE Growth of $BaF_2/(Ga,In)(As,Sb)$ Structures", Journal of Crystal Growth, vol. 81 (1987) pp. 552–556.
Chaudhari et al., "Calcium fluoride thin films on GaAs (100) for possible metal–insulator–semiconductor applications", Appl. Phys. Lett., vol. 62, No. 8, 22 Feb. 1993, pp. 852–854.
Hung, et al., "Epitaxial growth of alkaline earth fluoride films on HF-treated Si and $(NH_4)_2Sx$-treated GaAs without in situ cleaning", Appl. Phys. Lett. vol. 60, No. 2, 13 Jan. 1992, pp. 201–203.

*Primary Examiner*—Robert Kunemund
*Attorney, Agent, or Firm*—Roger D. Johnson

[57] ABSTRACT

A process for growing single crystal epitaxial $BaF_2$ layers on gallium arsenide substrates by slowly reacting $BaF_2$ vapor with the clean, hot GaAs substrate at 500° to 700° C. in high vacuum until a uniform, thin (~12Å) layer of reaction product is formed and then vapor depositing $BaF_2$ onto the reaction layer at room temperature to 400° C. to form the single crystal, epitaxial $BaF_2$ layer.

19 Claims, No Drawings

PROCESS FOR FORMING EPITAXIAL BAF₂ ON GAAS

BACKGROUND OF THE INVENTION

Materials used in semiconductor devices must have good semiconducting properties, good electron mobility, and the ability to host an epitaxial insulating material. Several materials are available which have good semiconducting properties and good electron mobilities but which are unsuitable because a good epitaxial insulator cannot be formed on them. Silicon, however, is widely used in semiconductor devices because epitaxial silicon dioxide forms naturally on silicon and silicon dioxide is an insulator. The disadvantage of silicon is that its mobility is not as high as in other semiconductors and silicon dioxide is not the strongest insulator available. This means that compromises in speed and performance are made when silicon is used in electronic devices.

Gallium arsenide (GaAs) is also a semiconductor and is used in some electronic applications. A device made out of GaAs would be faster than the same device made out of silicon because GaAs has an electron mobility that is considerably higher than that of silicon. Unfortunately, there is no native insulating oxide suitable for GaAs electronic devices.

Several materials have been used to provide insulating films on III-V compound semiconductor devices. Some of these films were previously used on silicon semiconductor devices. Examples include $SiO_2$, $Si_3N_4$, $Al_2O_3$, and $P_2O_3$ films. New films have also been developed specifically for the III-V compound semiconductors. For instance, A. J. Shuskus (U.S. Pat. No. 4,546,372) developed an essentially oxygen-free, amorphous, phosphorous-nitrogen glass passivating film for III-V compound semiconductors. Similarly, J. Nishizawa et al. (U.S. Pat. No. 4,436,770) disclose new gallium oxynitride and aluminum oxynitride insulating films for III-V compound semiconductors. These materials have found only limited application.

It would be desirable to provide a new method of depositing a new insulator material on gallium arsenide substrates.

SUMMARY OF THE INVENTION

According an object of this invention is to provide a new process for forming insulator layers on gallium arsenide substrates.

Another object of this invention is to provide a new method of depositing single crystal, epitaxial barium fluoride onto gallium arsenide substrates.

These and other objects of this invention are accomplished by providing a process of A. vapor depositing barium fluoride on a clean, hot single crystal gallium arsenide substrate at a temperature of from 500° to 700° C., in a vacuum having a background pressure of less than $10^8$ millibars and wherein the barium fluoride deposition is slow enough to allow the barium fluoride vapor to react with the gallium arsenide substrate surface and form a uniform, epitaxial coating of barium fluoride/gallium arsenide reaction product and continuing until the reaction product layer is completed and a single crystal epitaxial barium fluoride layer has begun to be formed on the reaction layer, and then B. reducing the temperature of the substrate to a temperature of from room temperature to 400° C. and depositing the barium fluoride at a rate of from 1 to 100Å per minute until the desired thickness of the uniform, single crystal, epitaxial barium fluoride layer has been achieved.

DETAILED DESCRIPTION OF THE PREFERRED EMBODIMENT

Copending United States patent application titled "BaF₂/GaAs Electronic Components", United States Navy Case No. 75,860, filed by Francisco Santiago and Tak-Kin Chu at the same time as this application is hereby incorporated by reference in its entirety. That application is drawn to gallium arsenide devices which incorporate insulator layers of single crystal, epitaxial barium fluoride which are grown directly onto the single crystal gallium arsenide substrate. The barium fluoride layers are formed in that application by reacting barium fluoride vapor with a clean, hot single crystal gallium arsenide substrate at from 500° to 700° C. in ultrahigh vacuum to form a uniform, epitaxial layer of one or two monolayers (12Å) of a barium fluoride/gallium arsenide reaction product and then depositing a uniform, single crystal epitaxial layer of barium fluoride on to the reaction product layer at the same temperature. The process of the present invention is based on the discovery that after the uniform, epitaxial barium fluoride/gallium arsenide reaction product layer is formed, the single crystal epitaxial barium fluoride layer may be deposited at temperatures of from room temperature to 400° C.

The term single crystal gallium arsenide or gallium arsenide crystal substrate includes gallium arsenide single crystal wafers, gallium arsenide epitaxial layers commonly known as epilayers on gallium arsenide single crystal wafers, doped gallium arsenide epilayers on gallium arsenide single crystal wafers, alloys of gallium arsenide (for example, gallium aluminum arsenide, gallium indium arsenide, etc.) on gallium arsenide single crystal wafers, heterostructures of super-lattice made of any combinations of alloys of gallium arsenide on gallium arsenide single crystal wafers, doped or undoped gallium arsenide epilayers on any suitable substrate materials, heterostructures of super-lattice made of combinations of alloys of gallium arsenide on suitable substrate materials.

The present process may be used to grow epitaxial BaF₂ directly onto a variety of gallium arsenide substrate surfaces. The gallium arsenide substrate bulk stoichiometry may be balanced, gallium rich, or arsenic rich. The gallium arsenide crystal substrate may be doped or undoped. The gallium arsenide crystal substrate may have any of the conventional orientations including (100), (111), and their equivalents. In the experiments and examples we used commercial standard electronic grade polished and etched (100) and (111 ) oriented crystal wafers.

The commercial standard grade gallium arsenide crystal wafers come with a polycrystalline oxide passivation layer that must be removed. The presence of the polycrystalline passivation layer can be detected by analytical techniques like x-ray photoelectron spectroscopy (XPS) and reflective high energy electron diffraction (RHEED). The passivation layer will show oxygen in the XPS spectrum and a RHEED diffraction pattern that shows scattered dots and concentric circles. Removal of the passivation layer leaves the bare gallium arsenide surface whose smoothness is confirmed by the RHEED pattern that shows ordered spots connected with streaks and the absence of oxygen in the XPS spectrum. Conventional methods for removing the passivation layer may be used. A preferred method is by annealing the gallium arsenide in a vacuum. In the Examples, the gallium arsenide crystal wafers were annealed in a VG Semicon V8OH deposition chamber for one hour at 600° C. in a vacuum of better than $1 \times 10^{-9}$ millibar.

A critical part of this invention is the formation of a thin, uniform, single crystal, epitaxial layer of barium fluoride/gallium arsenide reaction product on the surface of the gallium arsenide substrate. The barium fluoride/gallium arsenide reaction product is formed by exposing a clean, hot gallium arsenide single crystal substrate to barium fluoride vapor in ultrahigh vacuum. The temperature of the gallium arsenide substrate and the barium fluoride vapor flux rate are adjusted to allow the complete formation of the uniform reaction product layer before a substantial amount of barium fluoride can be deposited. The thickness of the barium fluoride/gallium arsenide reaction product layer is self limiting. After one or two monolayers (about 12Å) of the uniform reaction product layer is formed, the barium fluoride deposits as a single crystal epitaxial layer of barium fluoride on the reaction product layer. If the barium fluoride is deposited too rapidly before a uniform, single crystal epitaxial layer of barium fluoride/gallium arsenide reaction product is completely formed, epitaxial deposition of barium fluoride will occur in those places where the reaction product is first completed and a three dimensional island mode of barium fluoride growth will result. Channels between the barium fluoride islands present paths of conduction that defeat the insulating properties of the barium fluoride. This problem is avoided when, according to this invention, care is taken to slowly deposit barium fluoride initially so that a uniform, single crystal, epitaxial layer of reaction product is formed before substantial barium fluoride epitaxial formation begins. When this care is taken, the barium fluoride will deposit as a uniform, single crystal, epitaxial layer which is an excellent insulator.

The preferred method of producing the barium fluoride/gallium arsenide reaction layer on the gallium arsenide crystal substrate is illustrated by the example. A standard commercial grade gallium arsenide single crystal wafer is placed in a standard substrate heater in a commercial molecular beam epitaxial (MBE) deposition chamber model Semicon V8OH made by Vacuum Generators. The chamber is evacuated to a background pressure of preferably less than $10^{-8}$ millibars, more preferably less than $10^{-9}$ millibars, and still more preferably less than $10^{-10}$ millibars and is trapped with liquid nitrogen. The gallium arsenide wafer is heated for about an hour under vacuum at a heater temperature of 600° C. to remove the polycrystalline passivation layer from the gallium arsenide surface. Barium fluoride is then vapor deposited at a rate of 2.5Å per minute onto the clean, hot gallium arsenide substrate (600° C. heater temperature). The barium fluoride deposition is continued until the gallium arsenide reflective high energy electron diffraction (RHEED) pattern gives way to the epitaxial barium fluoride RHEED pattern. This takes about 5 minutes indicating that the barium fluoride/gallium arsenide reaction layer is about 12Å thick after which the single crystal epitaxial barium fluoride layer is deposited. If the gallium arsenide wafer surface has a (100) crystal orientation, the single crystal epitaxial barium fluoride layer will have a three dimensional (100) oriented structure as shown by RHEED pattern.

On the other hand, if the gallium arsenide wafer surface has a (111) crystal orientation, the single crystal epitaxial barium fluoride layer will have a two dimensional (111) oriented structure as shown by RHEED pattern. The rate of deposition of barium fluoride must be slow enough to allow the complete formation of the uniform, single crystal, epitaxial barium fluoride/gallium arsenide reaction product layer before substantial amounts of barium fluoride are deposited on the reaction product layer. To assure the best quality, it is preferable to deposit the barium fluoride at a rate of from 1 to 5Å per minute and more preferably at from 2 to 3Å per minute. At a deposition rate of 2.5Å per minute the uniform, single crystal epitaxial barium fluoride/gallium arsenide layer is formed in about 1 minute at 600° C. Finally, the temperature given is the substrate heater temperature. As shown by the example, the substrate is at a somewhat lower temperature. This is true for other commercial substrate heaters and is understood by those of ordinary skill in this art. Moreover, heater temperatures over the range of from 500° C. to 700° C. produce the same uniform, single crystal, epitaxial barium fluoride/gallium arsenide reaction product layer. Substrate heater temperature ranges are preferably from 500° C. to 700° C., more preferably from 550° C. to 650° C., and still more preferably from 575° C. to 625° C. At heater temperatures near the lower end of the range, the deposition rate is decreased to permit the complete formation of the reaction layer before a substantial amount of barium fluoride is deposited. In conclusion, a commercial substrate heater set to 600° C. and a MBE barium fluoride deposition rate of from 1 to 5Å per minute in an ultrahigh vacuum will produce the desired uniform, single crystal, epitaxial barium fluoride/gallium arsenide reaction layer on a clean single crystal gallium arsenide substrate.

The barium fluoride/gallium arsenide reaction product layer is too thin (about 12Å) for a determination of the actual structure and stoichiometric composition to be made. However, the same reaction product is consistently produced even at different substrate heater temperatures over the range of 500° C. to 700° C. Moreover, the reaction product can be characterized by a number of physical properties. First, it has a RHEED pattern similar to barium fluoride (same symmetry but different spot shapes). Next, XPS results indicate lower Ba 3d bonding energies than those of $BaF_2$. Most important, uniform single crystal, epitaxial barium fluoride is deposited on single crystal gallium arsenide substrates that are coated with a uniform, epitaxial barium fluoride/gallium arsenide reaction product layer under conditions that will produce amorphous or polycrystalline barium fluoride on a bare, clean single crystal gallium arsenide substrate without the reaction product layer.

Once the uniform, single crystal, epitaxial barium fluoride/gallium arsenide reaction product layer has been formed on the single crystal gallium arsenide substrate, the deposition of a uniform, single crystal, epitaxial barium fluoride insulator layer becomes simple. The temperature of the substrate and the rate of deposition of barium fluoride are no longer as critical. For instance, the example shows that barium fluoride deposited at a rate of about 50Å per minute ($20 \times 2.5$Å per minute) at temperatures of 400° C., 300° C. and at room temperature produces a uniform, single crystal epitaxial barium fluoride layer after the reaction layer has been formed. The crystal orientation of the uniform, single crystal epitaxial barium fluoride layer is the same as that of the single crystal gallium arsenide substrate. For example uniform (100) oriented single crystal epitaxial barium fluoride layers are deposited on (100) oriented single crystal gallium arsenide substrates and uniform (111) oriented single crystal epitaxial barium fluoride layers are deposited on (111) single crystal gallium arsenide substrates. This means that the intervening barium fluoride/gallium arsenide reaction product layer is uniform and of the same crystal orientation.

Specifically, after the uniform epitaxial barium fluoride/gallium arsenide layer has been formed, the gallium arsenide substrate temperature is lowered to a temperature in the range of preferably from room temperature to less than 500° C., more preferably from room temperature to 400° C., still more preferably from room temperature to 300° C., and most preferably room temperature. The deposition chamber vacuum is maintained at a background pressure of preferably less than $10^{-1}$ millibars, more preferably less than $10^{-9}$ millibars, and still more preferably less than $10^{-10}$ millibars while the barium fluoride vapor is deposited on the uniform, epitaxial barium fluoride/gallium arsenide at a rate of preferably 1 to 100Å per minute, more preferably 1 to 50Å per minute, and still more preferably from 1 to 5Å per minute to form a uniform, single crystal, epitaxial barium fluoride layer of the desired thickness.

The process of the present invention may be used in the manufacture of a metal insulator semiconductor field effect transistor (MISFET) according to the method disclosed in the Santiago and Chu application, supra. For example, a MISFET device may be produced by combining the present process within ion beam implantation as follows. First, a barium fluoride epitaxial crystal insulator layer is grown on a gallium arsenide substrate according to the process of this invention. Holes are left in the barium fluoride film for source and drain regions. The source and drain regions are then doped according to conventional techniques. Metal electrodes are then deposited onto the source and drain regions. Next an ion beam is used to implant dopant ions through the barium fluoride film into the channel region in gallium arsenide substrate. The metal electrodes protect the source and drain regions from the ion beam. The substrate is annealed to diffuse the ion implant dopant ions to complete the doping of the channel region.

Because the present process requires heating the substrate at a temperature of from 500° C. to 700° C. for only long enough to form the thin (12Å) barium fluoride/gallium arsenide reaction layer, this process can be used to form the barium fluoride insulator layer after the substrate has been doped to form semiconductor circuits. gallium arsenide epitaxial layers on gallium arsenide single crystal wafers, doped or undoped epitaxial layers of gallium arsenide alloys (for example, gallium aluminum arsenide, gallium indium arsenide, etc.) on single crystal gallium arsenide wafers, heterostructures of super-lattice made of combinations of gallium arsenide alloys on gallium arsenide single crystal wafers, doped or undoped gallium arsenide single crystal epitaxial layers on suitable substrate materials, doped or undoped epitaxial layers of gallium arsenide alloys on suitable substrate materials, and heterostructures of super-lattice made of combinations of gallium arsenide alloys on suitable substrate materials. More preferably the single crystal gallium arsenide substrate includes doped or undoped gallium arsenide single crystal wafers, doped or undoped gallium arsenide epitaxial layers on gallium arsenide single crystal wafers, and doped or undoped gallium arsenide single crystal epitaxial layers on suitable substrate materials. The gallium arsenide alloys include those that are conventionally used in semiconductor devices. Gallium arsenide alloy that are rich in gallium are preferred. The suitable substrate materials include materials that provide physical support for a thin epitaxial layer of gallium arsenide or gallium arsenide alloys without chemically or electrically interfering with the operation of the epitaxial layer. For example, a thin single crystal epitaxial layer of gallium arsenide on a hybrid semiconductor device or on a chemically inert, electrically insulating circuit board structure. Thus, the single crystal gallium arsenide substrate need not be a wafer but rather can be a thin epitaxial layer requiring support by a non-gallium arsenide material.

The general nature of the invention having been set forth, the following example is presented as a specific illustrations thereof. It will be understood that the invention is not limited to this specific example but is susceptible to various modifications that will be recognized by one of ordinary skill in the art.

EXAMPLE

The barium fluoride film was grown on gallium arsenide using a standard procedure called molecular beam epitaxy (MBE). The film was grown inside a commercial MBE deposition chamber made by Vacuum Generators (model V80-M). The MBE system above has both Knudsen cells and e-beam sources and a 30 kV RHEED system to monitor the film structure during film deposition. The substrate heater is capable of holding up to 3 inch diameter wafers and control the substrate temperature to within ±0.1° C. at 1000° C. and a maximum deviation of the temperature across the substrate of ±0.1° C. The temperature is controlled by using a thermocouple located inside the substrate heater. All temperatures quoted here are the substrate heater thermocouple readings. Independent measurements of the sample temperatures done using an optical pyrometer shows that when the thermocouple monitoring the substrate heater read 750.0° C. the substrate temperature was closer to 710.0° C.±0.5° C. (0.5° C. is the accuracy of the optical pyrometer). Differences between the substrate temperature and the thermocouple readings change with temperature. However reproducibility in the thermocouple readings results in reproducibility in the growth conditions. The pressure inside the MBE system is kept below $3.0 \times 10^{-11}$ mbars most of the time. When the substrate and Knudsen cells containing the source are heated to the conditions for deposition the pressure inside the chamber will rise to a pressure not above $1.0 \times 10^{-10}$ mbars. The gallium arsenide crystal used was a commercial (100) oriented 2 inch diameter wafer with a carrier concentration of $3.0 \times 10^{18}$ carriers/cm$^3$ and an arsenic to gallium concentration ratio of 50/50. The wafer was polished and etched using standard industry procedures. Before deposition of the film the gallium arsenide crystal was cleaned by standard heat treatment in ultrahigh vacuum. Then the gallium arsenide crystal wafer was heated at 600° C. until the electron diffraction pattern looked "streaky". This took about 60 minutes.

Once the gallium arsenide was heat treated the substrate crystal (GaAs) was kept at 600° C.±1° C. The barium fluoride was heated in a standard Knudsen cell inside the MBE system. The cell containing the barium fluoride was heated until 1000° C.±°C. When a consistent flux was obtained, deposition of barium fluoride at a rate of 2.5Å per minute was achieved by opening shutters located in front of both the barium fluoride source and the gallium arsenide crystal.

The barium fluoride deposition rate was only 2.5Å per minute and was stopped when the GaAs RHEED pattern gave way to a three dimensional epitaxial BaF2 RHEED pattern. This happened in less than 5 minutes. The substrate temperature was then reduced to 500°, 400°, and 300° C. and held for 30 minutes at each temperature while deposition of BaF2 at 2.5Å per minute continued. The RHEED pattern was continuously monitored during this time. Other than a decrease in the spot size and an increase in spot intensity, no change in the RHEED pattern was detected. After depositing for 30 minutes at 300° C., the BaF$_2$ source temperature was raised from 1000° C. to 1100° C. The resultant flux gauge reading increased by a factor of about twenty. (to about 50Å per minute) The RHEED pattern, however, was not affected. The film was then stored in the deposition chamber for four days. BaF2 deposition was resumed with a substrate temperature of 25° C. and at the same range of flux gauge readings. The RHEED pattern remained unchanged.

Obviously, numerous other modifications and variations of the present invention are possible in light of the foregoing teachings. It is therefore to be understood that within the scope of the appended claims the invention may be practiced otherwise than as specifically described.

What is claimed is:

1. A process for forming a uniform, single crystal, epitaxial layer of barium fluoride on a single crystal gallium arsenide substrate comprising
    A. vapor depositing barium fluoride on a clean, hot single crystal gallium arsenide substrate at a temperature of from 500° to 700° C., in a vacuum having a background pressure of less than $10^{-8}$ millibars and wherein the barium fluoride deposition is slow enough to allow the barium fluoride vapor to react with the gallium arsenide substrate surface and form a uniform, epitaxial coating of barium fluoride/gallium arsenide reaction product and continuing until the reaction product layer is completed and a single crystal epitaxial barium fluoride has begun to be formed on the reaction layer, and then
    B. reducing the temperature of the substrate to a temperature of from room temperature to 400° C. and depositing the barium fluoride at a rate of from 1 to 100Å per minute until the desired thickness of uniform, single crystal, epitaxial barium fluoride has been achieved.

2. The process of claim 1 wherein the temperature in step A is from 550° to 650° C.

3. The process of claim 2 wherein the temperature in step A is from 575° to 625° C.

4. The process of claim 1 wherein the vacuum in steps A and B has a background pressure of less than $10^{-9}$ millibars.

5. The process of claim 4 wherein the vacuum in steps A and B has a background pressure of less than $10^{-10}$ millibars.

6. The process of claim 1 wherein barium fluoride deposition rate in step A is from 1 to 5Å per minute.

7. The process of claim 6 wherein the barium fluoride deposition rate in step A is from 2 to 3Å per minute.

8. The process of claim 1 wherein the temperature used in step B is from room temperature to 300° C.

9. The process of claim 8 wherein the temperature used in step B is room temperature.

10. The process of claim 1 wherein the barium fluoride deposition rate in step B is from 1 to 50Å per minute.

11. The process of claim 10 wherein the barium fluoride deposition rate in step B is from 1 to 5Å per minute.

12. The process of claim 1 wherein the single crystal gallium arsenide substrate is selected from the group consisting of gallium arsenide single crystal wafers, gallium arsenide epitaxial layers on gallium arsenide single crystal wafers, epitaxial layers of gallium arsenide alloys on single crystal gallium arsenide wafers, heterostructures of super-lattice made of combinations of gallium arsenide alloys on gallium arsenide single wafers, gallium arsenide single crystal epitaxial layers on suitable substrate materials, epitaxial layers of gallium arsenide alloys on suitable substrate materials, and heterostructures of super-lattice made of combinations of gallium arsenide alloys on suitable substrate materials.

13. The process of claim 12 wherein the single crystal gallium arsenide substrate is selected from the group consisting of gallium arsenide single crystal wafers, gallium arsenide epitaxial layers on gallium arsenide single crystal wafers, and gallium arsenide single crystal epitaxial layers on suitable substrate materials.

14. The process of claim 13 wherein the single crystal gallium arsenide substrate is selected from the group consisting of gallium arsenide single crystal wafers.

15. The process of claim 13 wherein the single crystal gallium arsenide substrate is selected from the group consisting of gallium arsenide single crystal epitaxial layers on gallium arsenide single crystal wafers.

16. The process of claim 1 wherein the single crystal gallium arsenide substrate surface has a (100) or equivalent orientation.

17. The process of claim 16 wherein the single crystal gallium arsenide substrate surface has a (100) orientation.

18. The process of claim 1 wherein the single crystal gallium arsenide substrate surface has a (111) or equivalent orientation.

19. The process of claim 18 wherein the single crystal gallium arsenide substrate surface has a (111) orientation.

* * * * *